United States Patent [19]

Vlatkovic et al.

[11] Patent Number: 5,530,396
[45] Date of Patent: Jun. 25, 1996

[54] DAMPED EMI INPUT FILTER POWER FACTOR CORRECTION CIRCUITS

[75] Inventors: Vlatko Vlatkovic; Fred C. Lee; Dusan Borojevic, all of Blacksburg, Va.

[73] Assignee: Center for Innovative Technology, Herndon, Va.

[21] Appl. No.: 308,806

[22] Filed: Sep. 19, 1994

[51] Int. Cl.⁶ ........................................................ H04B 1/10
[52] U.S. Cl. ........................... 327/552; 327/304; 327/551; 327/561
[58] Field of Search .................................. 327/551, 552, 327/560, 561, 300, 304

[56] References Cited

U.S. PATENT DOCUMENTS

| | | | |
|---|---|---|---|
| 4,074,087 | 2/1978 | Blake, Jr. et al. | 379/344 |
| 4,514,686 | 4/1985 | Mayfield | 327/356 |
| 4,594,648 | 6/1986 | Gallios | 327/552 |
| 4,748,345 | 5/1988 | Landrgraf | 327/552 |
| 5,121,009 | 6/1992 | Braathen | 327/552 |
| 5,187,384 | 2/1993 | Blöckl | 327/190 |
| 5,304,898 | 4/1994 | Kataoka et al. | 315/411 |
| 5,305,191 | 4/1994 | Loftus, Jr. | 363/17 |
| 5,410,221 | 4/1995 | Mattas et al. | 315/307 |

*Primary Examiner*—Terry Cunningham
*Attorney, Agent, or Firm*—Whitham, Curtis, Whitham & McGinn

[57] ABSTRACT

An active damping circuit for an electromagnetic interference (EMI) filter for power factor correction (PFC) circuit is provided which simulates a line damping impedance which actively varies according to sensed line current. The active damping circuit comprises an nth-order, Cauer-Chebyshev, low-pass filter having input series damping impedance ($Z_d$) simulated with a power operational amplifier and high-frequency isolation transformer. The simulated damping impedance offers greatly reduced size and power dissipation as compared to prior art passive schemes which typically require large impedance components for damping. A passive damping circuit is also shown which involves providing an alternate inductive current path in parallel with a damping resistor whereby lower frequency currents are diverted through the alternate current path and higher frequency currents continue to flow through the damping resistor. In this manner, the damping action of the damping resistor is attenuated for lower frequencies but remains unaffected for higher frequencies.

2 Claims, 7 Drawing Sheets

2 ms/div

DAMPED EMI INPUT FILTER POWER FACTOR CORRECTION CIRCUITS

BACKGROUND OF THE INVENTION

Field of the Invention

The present invention generally relates to electromagnetic interference (EMI) input filters for power factor correction (PFC) circuits and, more particularly, to EMI input filters for a PFC circuits employing an impedence damping circuit.

Description of the Prior Art

Design of electromagnetic interference (EMI) input filters for power factor correction (PFC) circuits is becoming increasingly important. This is due, at least in part, to increased power line sensitivity to EMI disturbances and, perhaps more importantly, to more stringent government and industry imposed EMI and PFC standards. With the rapid development of power electronics technology, the size of switching power converters is constantly decreasing. Unfortunately, this is not true for the size of the input filters which, in higher power PFC circuits, account for a large portion of the converter's weight and volume.

EMI filters for PFC circuits must be designed to meet three main requirements. First, the EMI input filter must provide switching noise attenuation within preset guidelines. Such guidelines are typically dictated by EMI control standards, such as, for example, VDE 0871, FCC, or Mil. Std. 461C, etc. Most standards require very low EMI levels, so that the required switching frequency attenuation, for a typical 1 kW=10 kW converter switching in the 60 kHz range, is between 60 and 120 dB, depending on the converter power and topology.

Second, the PFC circuit input filter design must achieve a low input displacement angle between falter input voltage and current (i.e. achieve a power factor near unity). FIG. 1a shows a simplified diagram of a PFC converter having a simple LC network input filter. FIG. 1b shows the phasor diagram of the system currents and voltages. A typical PFC circuit is operated in a way that produces converter current, $i_a$, that is in phase with the converter voltage, $v_a$. Since the voltage drop across the input filter inductor L is very small at line frequency, the voltage at the converter input is essentially equal to the line voltage $v_A$. The voltage $v_a$ causes reactive current $i_c$ to flow through the filter capacitor C. The total current drawn from the line $i_A$, is therefore, phase shifted relative to the input voltage by the angle θ, resulting in reduced power factor. If $v_a$ and $i_a$ are given by:

$$v_i = v_A = V_m \cos \omega t; i_a = I_m \cos \omega t \quad (1)$$

where $V_m$ and $I_m$ are the voltage and current amplitudes, respectively, the input current $I_A$ in FIG. 1 is:

$$i_A = i_a + i_c = I_m \cos \omega t - \omega C V_m \sin \omega t \quad (2)$$

Therefore, the current $i_A$ leads the voltage $v_A$ by a phase angle:

$$\theta = \tan^{-1} \frac{\omega C V_m}{I_m} \quad (3)$$

The phase shift is proportional to the filter capacitance value, so in order to maintain high input displacement factor (IDF), defined as IDF≡cos θ, the capacitor size has to be minimized. This typically translates into an upper limit value for the filter capacitor, which from (3) is:

$$C_{max} = \frac{I_m}{\omega V_m} \tan(\cos^{-1} IDF) \quad (4)$$

In the case of multi-stage filters, $C_{max}$ represents the limit for the sum of all capacitances in the filter. The capacitor size limitation has deep implications on the PFC circuit filter design. In order to meet the required attenuation specifications, the filter inductor size increases, resulting in overall filter size increase. Filter damping methods typically applied in the dc-dc converter filters cannot be used. The input filter output impedance, determined by the total filter capacitance, is more difficult to control, potentially resulting in converter instability.

Third, the filter must not compromise overall system stability. This amounts to controlling the impedance interaction between the input filter and converter. In general, the filter output impedance should be as low as possible when compared to the converter input impedance. The filter control impedance can be reduced by increasing the filter capacitor size. The impedance interaction constraint will practically determine the lower bound on the filter capacitor value. Proper filter pole damping is extremely important for achieving low filter output impedance and overall system stability. As discussed below, the damping methods used in PFC input filters are rather different than those used in the dc-dc converter filters.

The requirements outlined above lead to the conclusion that high-order filters with high stop-band transfer characteristics have to be used in PFC circuits. Using filters with such characteristics enables filter design with relatively low switching frequency to filter corner frequency ratio, thereby reducing the filter component values and filter size.

One filter type that is known to provide these features is the Cauer-Chebyshev (CC) filter, also known as the elliptic-integral filter. A two-stage CC filter with normalized component values, and a typical attenuation characteristic are shown in FIG. 2a and 2b, respectively. The CC filter shown in FIG. 2a can be used either in a single-phase or a three-phase PFC system. In a three-phase system the filter of FIG. 2a would be a per-phase filter connected between the line and neutral points.

FIG. 3 shows four possible filter pole damping methods. The damping method shown in FIG. 3a is typically used in dc-dc converters. Unfortunately, this method is not applicable in ac power converters since in order for the damping resistor $R_d$ to be effective, the capacitor in series with $R_d$ has to be at least ten times bigger than the other filter capacitor. This typically causes excessive damping resistor dissipation at line frequency due to the ac current flowing through the parallel R-C damping branch.

The damping method in FIG. 3b uses a parallel R-L branch 10. This method eliminates the excessive resistor dissipation, and is therefore widely used in ac power converter filters. The drawback of this method is that the parallel R-L branch 10 provides an alternative path for high-frequency current, thus deteriorating the high-frequency attenuation capability of the filter. The use of this damping method results in excessively large filter components, because in order to meet the high-frequency attenuation characteristic, the filter has to be over designed by typically more than 50% compared to other filters.

The damping method shown in FIG. 3c provides an optimal filter attenuation characteristic, and is commonly used in low-power electronic circuits. This method, however cannot be used in power electronics circuits due to excessive power dissipation in the damping resistor $R_d$.

SUMMARY OF THE INVENTION

It is therefore an object of the present invention to provide a damped EMI input filter for a power factor correction (PFC) circuit, commonly used at the input stage of a switchmode power supply (SMPS);

It is yet another object of the present invention to provide an inexpensive EMI input filter for a SMPS which has reduced weight and volume.

According to the invention, an active damping circuit for an electromagnetic interference (EMI) filter for power factor correction (PFC) circuit is provided which simulates a line damping impedance which actively varies according to sensed line current. The active damping circuit comprises an nth-order Cauer-Chebyshev low-pass filter having input series damping impedance ($R_d$) simulated with a power operational amplifier and high-frequency isolation transformers. The simulated damping impedance offers greatly reduced size and power dissipation as compared to prior art passive schemes which typically require large impedance components for damping.

A passive damping circuit is also shown which involves providing an alternate inductive current path in parallel with a damping resistor whereby lower frequency currents are diverted through the alternate current path and higher frequency currents continue through the damping resistor. In this manner, the damping action of the damping resistor is attenuated at lower frequencies but remains unaffected for higher frequencies.

BRIEF DESCRIPTION OF THE DRAWINGS

The foregoing and other objects, aspects and advantages will be better understood from the following detailed description of a preferred embodiment of the invention with reference to the drawings, in which:

FIG. 1b is a current and voltage phasor diagram for the circuit shown in FIG. 1a;

FIG. 4b is an impedance characteristic diagram for the active damping circuit shown in FIG. 4a;

DETAILED DESCRIPTION OF A PREFERRED EMBODIMENT OF THE INVENTION

Figure 3A:
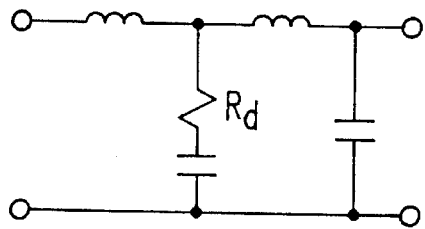
FIGS. 3a–c are three passive filter pole damping circuits.
Figure 3B:
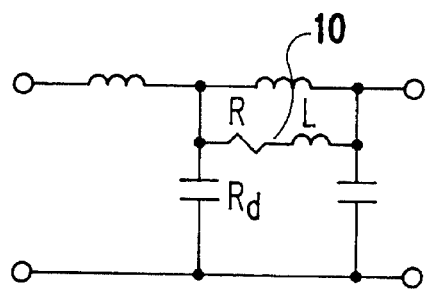
Figure 3C:
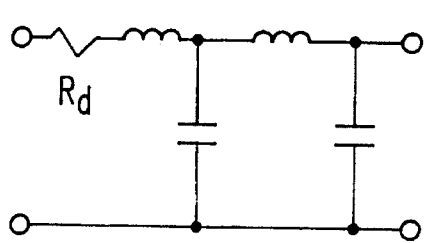
Figure 3D:
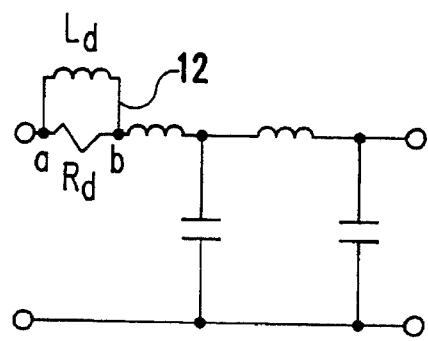
FIG. 3d is a passive filter pole damping circuit according to one embodiment of the present invention.

Referring now to the drawings, and more particularly to FIG. 3d, there is shown a new passive damping circuit used as the input filter for a PFC circuit for a SMPS which solves the excessive damping resistor power dissipation problem found in the circuit shown in FIG. 3c without affecting the damping action of the resistor at high frequencies. This is accomplished by providing an alternate line current path 12 through an inductor $L_d$. Lower frequency currents are routed through the alternate current path while higher frequency currents continue to pass through the damping resistor. The main drawback of this damping method is that the corner frequency of the damping network, given by $f_d = R/(2\pi L)$, has to be significantly lower than the lowest frequency of the filter pole. This requirement typically results in a large value of inductor $L_d$. If however, smaller inductor size is a design consideration, an active impedance simulation scheme may be used.

Figure 4A:
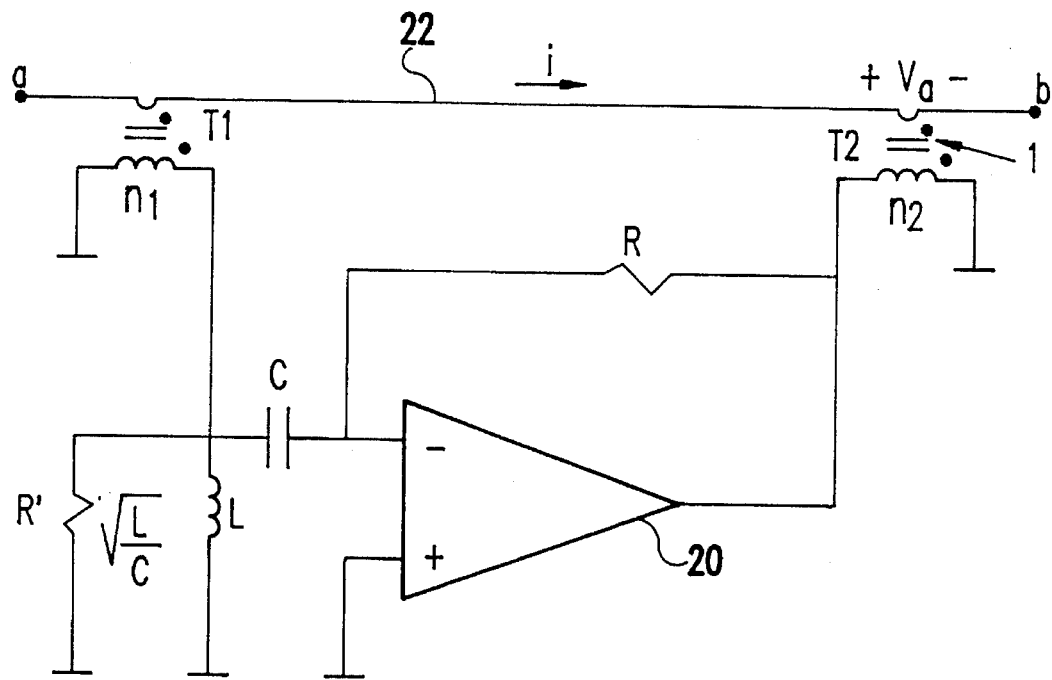
FIG. 4a is an active damping circuit according to an embodiment of the present invention.

Referring now to FIG. 4a, an active damping circuit is shown which may replace $R_d$ and $L_d$ connected between points a and b in FIG. 3d with an nth-order Cauer-Chebyshev (CC), low-pass filter. The input series damping impedance, $R_d$ and $L_d$, is implemented with a power operational amplifier 20 and a two high-frequency isolation transformers. FIG. 4a shows the first transformer labeled as T1 and the second as T2. The primary winding of T1 is used to sense current flowing in the line 22 and the secondary winding connects to the operational amplifier 20. The low-frequency current components sensed by T1 are by-passed to ground through inductor L. The high-frequency current components flow through capacitor C and resistor R to create a voltage at the output of the operational amplifier 20. The voltage $v_d$ at high frequencies is proportional to the line current, i.e. $v_d = R(I/n_1)$, where $n_1$ is the turns of T1. This voltage is impressed across the secondary winding of the transformer T2, so that the effective resistance seen in the primary is:

$$R_d \equiv \frac{V}{I} = \frac{R}{n_1 n_2} \tag{5}$$

Figure 4B:
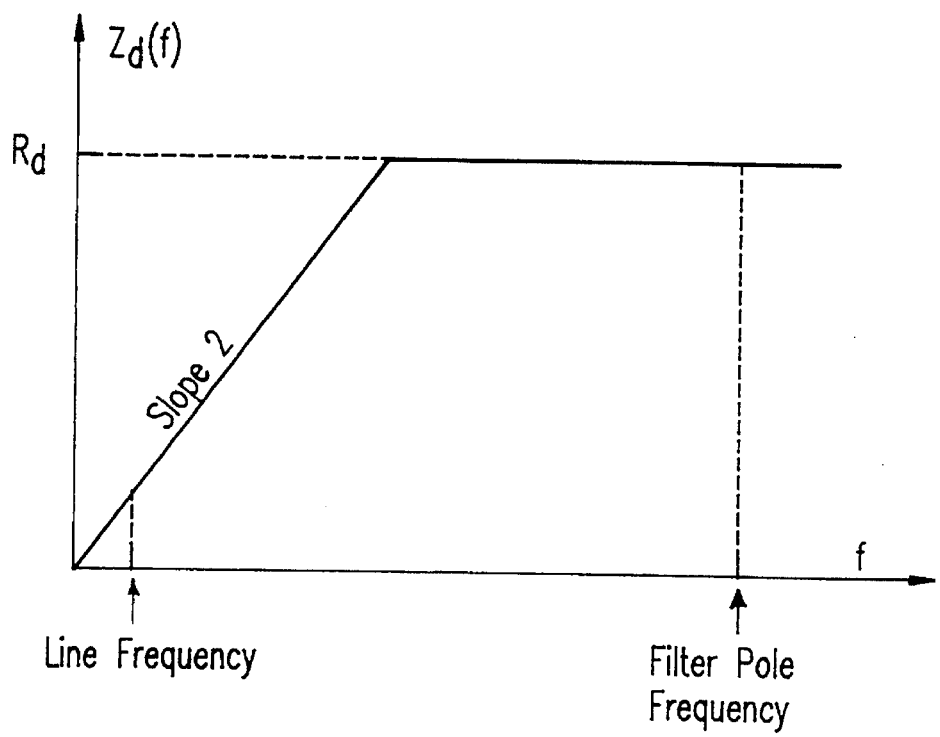

The corner frequency of L and C has to be set to be much higher than to line frequency, and much lower than the lowest input filter pole frequency. The resistor R' in parallel with L provides damping for the resonant circuit formed by L and C. The theoretical impedance characteristic Z(f) as seen by T1 is shown the graph shown in FIG. 4b. The graph shows low-loss inductive characteristic at line frequency and a resistive nature at frequencies close to the filter poles. The inventive active circuit provides significant savings in size compared to the passive damping circuit realization. The power processed by the circuit is typically less than 0.1% of the total converter power.

A method for calculating component values for the Cauer-Chebyshev (CC), low-pass input filter for the present invention may be carried out as follows:

1. The allowable EMI voltage ($V_{emi}$) at the switching frequency from applicable EMI standards must be determined. $V_{emi}$ is typically specified as voltage drop on a resistor $R_{lisn}$ (line impedance stabilization network) caused by the converter current $I_{line}$.

2. The switching frequency current, $I_{sw}$, generated by the converter must be determined. This can be done either analytically or by measurement.

3. The required filter attenuation $A_{min}$ at the switching frequency as:

$$A_{min} = \frac{R_{lisn} I_{sw}}{V_{emi}} \tag{6}$$

4. Choose an input displacement factor constraint. The constraint is chosen as a desired minimum IDF under certain line voltage, $V_{line}$, and current, $I_{line}$, conditions, typically high-line, partial load.

5. Calculate the total maximum filter capacitance using equation (4), with $I_m = 1_{line}$, and $V_m = V_{line}$.

6. Choose the filter order using a reasonable passband ripple ($A_{max} \approx 2dB$) and assuming that the converter is running under no-load condition ($K^2=\infty$). The choice may be made either using filter order nomographs, as found in A. I. Zverev, *Handbook of Filter Synthesis*, 1967, which is herein incorporated by reference, or by reading filter tables. There is some freedom in this step. Filters of higher order may end up being smaller than those of lower order.

7. Normalized the filter parameters from the filter table in the last step.

Figure 1A:
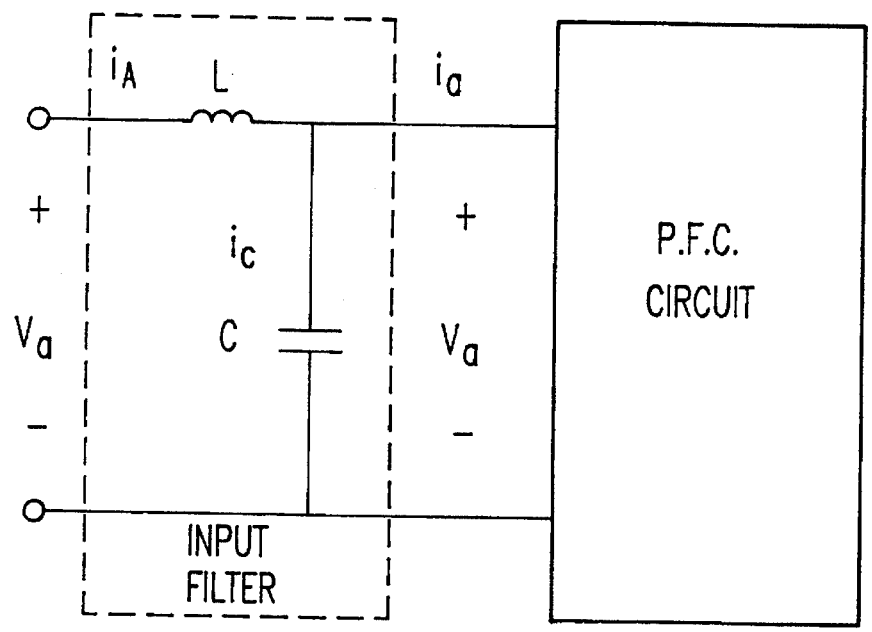
FIG. 1a is diagram showing a simplified power factor correction circuit and input filter.
Figure 1B:
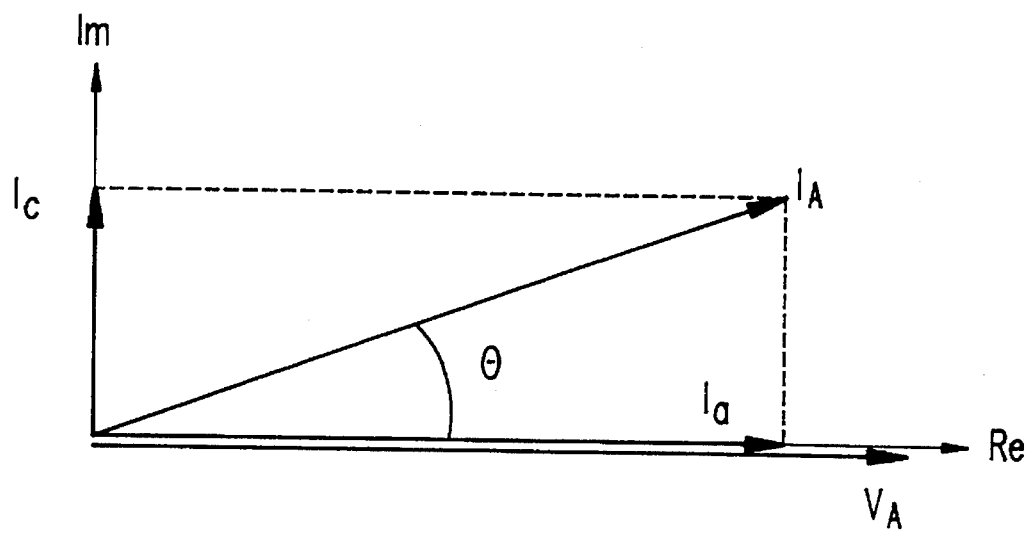
Figure 2A:
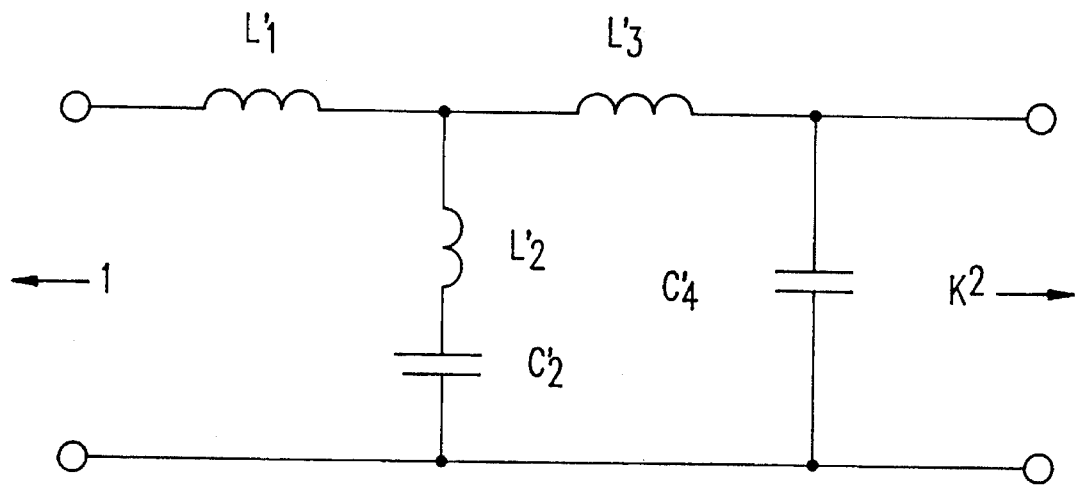
FIGS. 2a and 2b is a Cauer-Chebyshev filter and a typical filter attenuation graph, respectively.
Figure 2B:
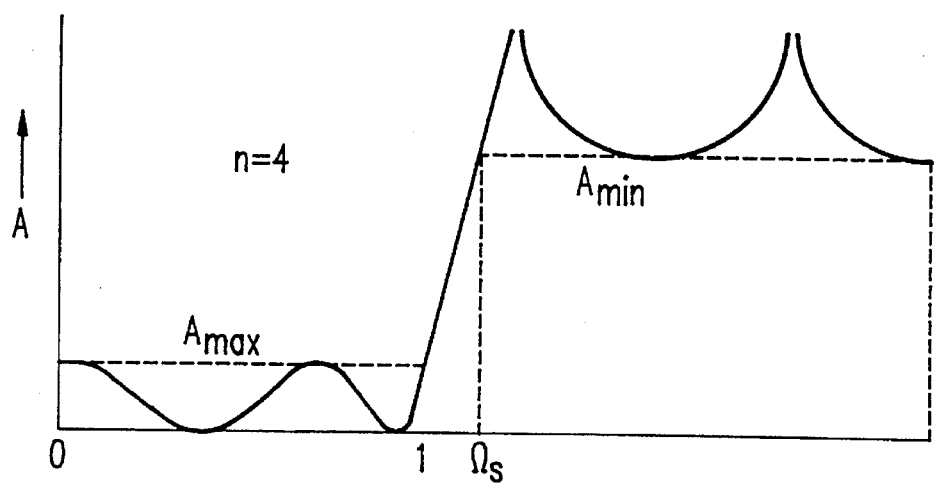

8. Calculate the reference frequency $\omega_r$, as:

$$\omega_r = 0.8 \frac{2\pi f_{sw}}{\Omega_s} \quad (7)$$

where $f_{sw}$ is the converter switching frequency, and $\Omega_s$ is as defined in FIG. 2b. With the reference frequency calculated in this manner, the frequency of the filter transfer function first notch will be 20% below the switching frequency. It is important to place the switching frequency sufficiently far from the transition region, so that any variation of filter component values does not influence its attenuation characteristic at switching frequency significantly.

9. Calculate the damping resistor as:

$$R_d = \frac{\sum_{i=1}^{i=n/2} C}{\omega_r C_{max}} \quad (8)$$

10. Denormalize the remaining filter components using:

$$L = \frac{L' R_d}{\omega_r} \; ; \; C = \frac{C'}{\omega_r R_d} \quad (9)$$

11. Choose the transformer turns ratios $n_1$ and $n_2$ according to the maximum line current and the operational amplifier voltage and current capabilities. Calculate R from equation (5). Use T1's magnetizing inductance as L, and calculate C so that $1/(2\pi\sqrt{LC})$ is much higher than the line frequency, and much lower than the lowest filter pole frequency.

EXAMPLE

For this example, a per-phase filter for a 1 kW, three-phase buck rectifier switching at 100 kHz, is designed as follows:

1. The filter is designed according to the VDE0871 'Class A' specifications which allow no more than $V_{emi}=74$ dBµV of switching noise at 100 kHz with $R_{lisn}=50 \, \Omega$.

2. The converter is producing $I_{sw}=1$ A.

3. This yields a required filter switching frequency attenuation of $A_{min}=80$ dB.

4. IDF is required to be IDV≧0.94 with $V_{max}=170$V and $I_{max}=3.5$A.

5. This yields $C_{max}=14$ µF.

6. The filter order is chosen as n=4 with $A_{max}=1.25$ dB.

7. The normalized filter parameters, as shown on pages 200–201 of A. I. Zverev, supra, are $\Omega_s=4.46$, $L'_1=1.11$, $L'_2=0.03$, $L'_3=1.96$, $C'_2=1.36$, and $C'_4=1.25$.

8. The reference frequency is $\Omega_r=112700$ rad/s.

9. The damping resistor is $R_d=1.7 \, \Omega$.

10. The denormalized filter parameters are $L_1=17$ µH, $L_2=0.5$ µH, $L_3=30$ µH, and $C_2=C_4=17 \, 82$ F.

11. The active damping is implemented with $n_1=n_2=50$, which gives R=4.3 kΩ. The inductance value is chosen as L=16 mH, which is actually the magnetizing inductance of T1. Since the lowest filter pole is at 5 kHz, the L-C corner frequency is chosen at 1 kHz, which gives C=1.5 µF. The damping scheme is implemented with the PA26 power operational amplifier.

Figure 5A:
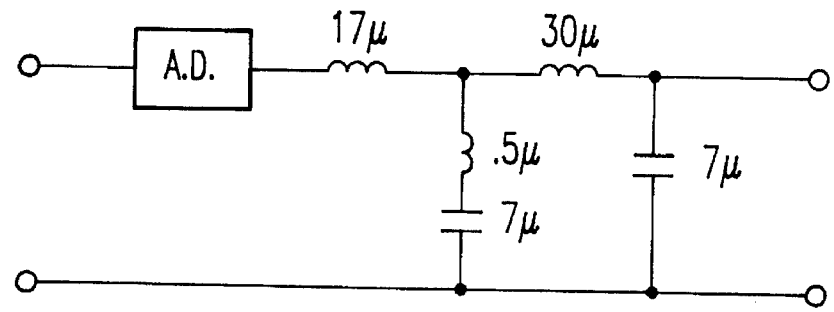
FIGS. 5a–c are three example filters used to illustrate the benefits of the present invention.
Figure 5B:
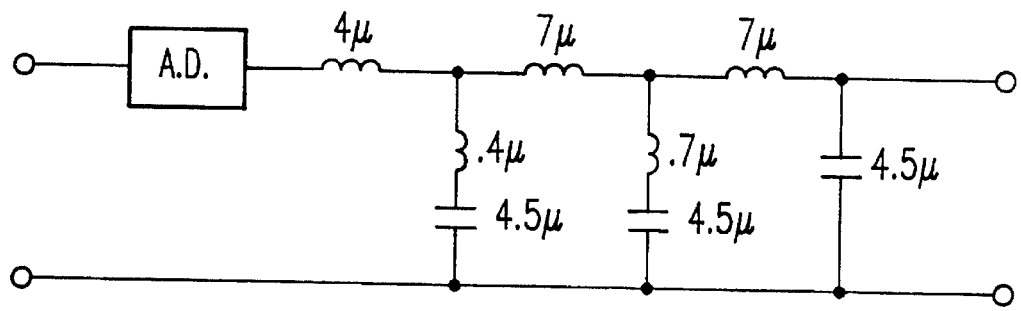

FIG. 5a shows the two-stage filter designed in the above example. The presented procedure is applicable to the design of filters of any order. A possible three-stage implementation of the input filter that meets the specifications of the example is shown in FIG. 5b. The two and three stage filters illustrate the possibility of reducing the overall filter size by increasing the number of filter stages.

Figure 5C:
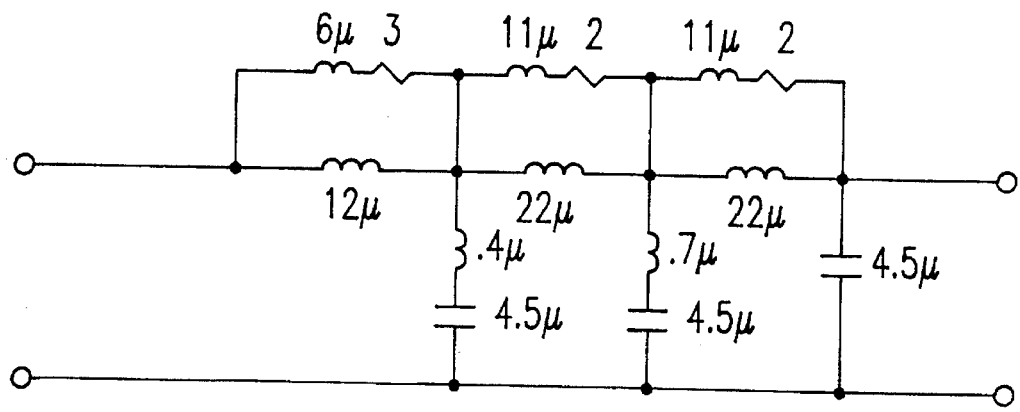

FIG. 5c shows a three-stage filter designed to meet the specifications of the example, but using the standard parallel R-L damping method. The total inductance in this filter is around 60 µH as compared to only 18 µH in the actively damped filter. The reduction of inductor size leads both to significant reduction of filter size and also the reduction of the filter output impedance, thus contributing to the overall system stability.

Figure 6:
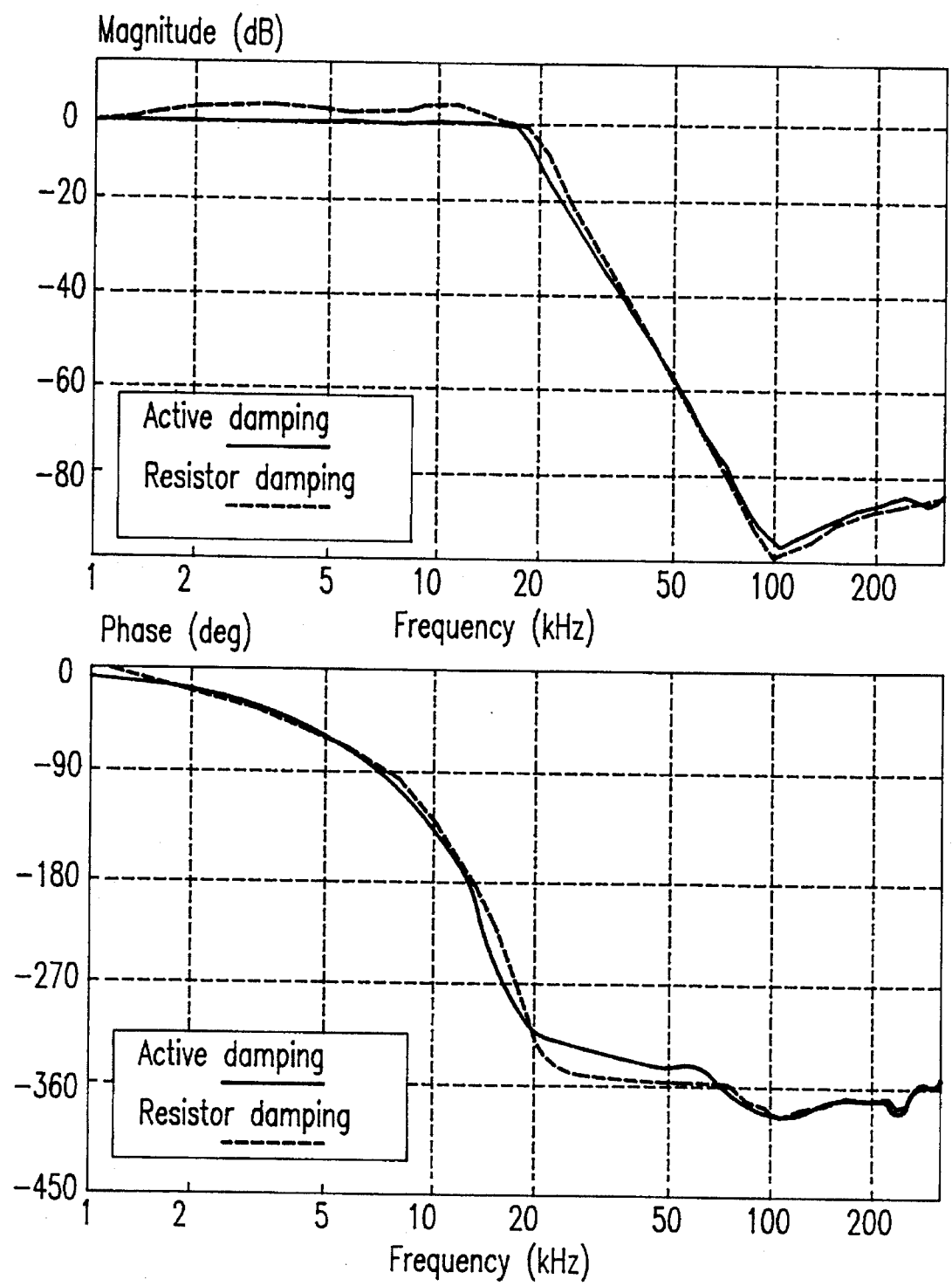
FIG. 6 is a transfer function diagram comparing active damping of the present invention to resistor damping.

The filter presented in the design example has been implemented and tested. FIG. 6 shows the measured transfer functions of the implemented filter which is damped passively using only the 1.7 Ω series resistor (circuit shown in FIG. 3c), and of the filter with active damping. This demonstrates that the active damping scheme provides the required damping without affecting the ideal filter transfer function.

Figure 7A:
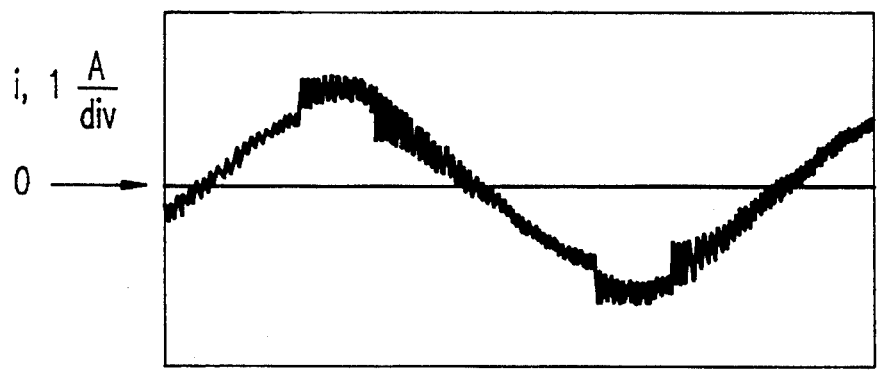
FIGS. 7a–7c are filter responses to current transients.
Figure 7B:
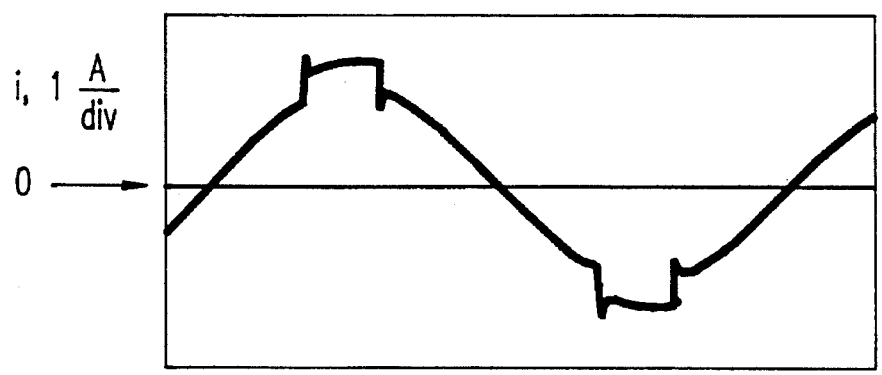
Figure 7C:
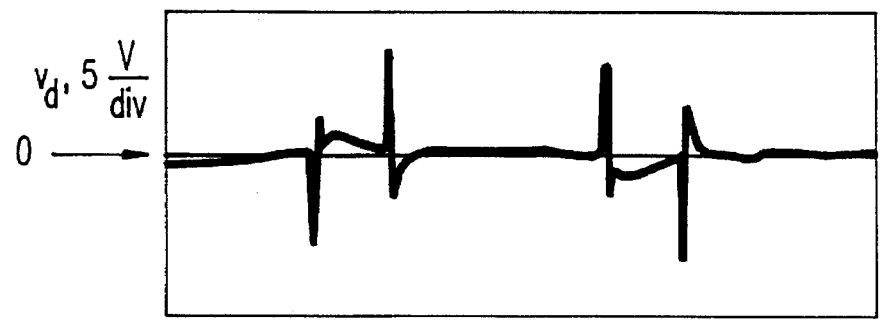

FIG. 7 shows the damping circuit performance under large signal transient conditions where the filter input current (i of the circuit shown in FIG. 4a) is not damped, i.e. with the active damping circuit turned off. The filter is connected to a converter working with 1A square-wave current transient. The high-frequency oscillations originate from the undamped 5 kHz filter pole. FIG. 7b shows the same current when the active damping circuitry according to the present invention is operational. FIG. 7c shows the operational amplifier output voltage ($v_d$, FIG. 4a). It is seen that even though there is a large 60 Hz current component in the filter current, the voltage $v_d$ contains only a very small 60 Hz component.

While the invention has been described in terms of a single preferred embodiment, those skilled in the art will recognize that the invention can be practiced with modification within the spirit and scope of the appended claims.

What is claimed is:

1. An active damping circuit for an input filter of a power supply, comprising:

an operational amplifier;

a first transformer magnetically connecting said operational amplifier to a filter line, said first transformer having a first winding connected to an input terminal of said operational amplifier and to electrical ground, and a second winding sensing line current in said line;

a second transformer having a first winding connected to an output terminal of said operational amplifier and to electrical ground, and a second winding impressing a voltage across two points on said line proportional to said line current to simulate an impedance, a first resistor connected between said first transformer and electrical ground;

an inductor connected in parallel with said first resistor; and a second resistor connected in a feedback path between said output terminal of said operational amplifier and said input terminal of said operational amplifier.

2. An active damping circuit as recited in claim 1, wherein said first winding of said first transformer is connected through a capacitor to an inverting input of said operational amplifier.

* * * * *